United States Patent
Yeo et al.

(10) Patent No.: US 6,303,494 B1
(45) Date of Patent: Oct. 16, 2001

(54) METHOD OF FORMING GATE ELECTRODE IN SEMICONDUCTOR DEVICE

(75) Inventors: In Seok Yeo; Se Aug Jang, both of Kyoungki-do (KR)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 0 days.

(21) Appl. No.: 09/460,815

(22) Filed: Dec. 14, 1999

(30) Foreign Application Priority Data

Dec. 24, 1998 (KR) ................................. 98-58595

(51) Int. Cl.⁷ ................................................. H01L 27/08
(52) U.S. Cl. ................ 438/653; 438/584; 438/585; 438/660; 438/689; 438/722
(58) Field of Search .................... 438/585, 653, 438/660, 689, 722, 584

(56) References Cited

U.S. PATENT DOCUMENTS

| | | | |
|---|---|---|---|
| 4,839,700 | 6/1989 | Ramesham et al. | 357/2 |
| 5,264,380 | 11/1993 | Pfiester | 437/37 |
| 5,723,893 | 3/1998 | Yu et al. | 257/413 |
| 5,801,428 | 9/1998 | Felde et al. | 257/414 |
| 5,905,278 | 5/1999 | Nakabayashi et al. | 257/296 |
| 5,907,780 | 5/1999 | Gilmer et al. | 438/299 |

FOREIGN PATENT DOCUMENTS

| | | | |
|---|---|---|---|
| 59-079573 | 5/1984 | (JP) | H01L/29/78 |
| 02002134 | 1/1990 | (JP) | H01L/21/336 |
| 03286569 | 12/1991 | (JP) | H01L/29/48 |
| 05048095 | 2/1993 | (JP) | H01L/29/784 |
| 09246490 | * 9/1997 | (JP) | 27/108 |
| 10294431 | * 11/1998 | (JP) | 27/10 |

* cited by examiner

*Primary Examiner*—Charles Bowers
*Assistant Examiner*—Lisa Kiloay

(57) ABSTRACT

A method of forming a gate electrode in a semiconductor device which can effectively prevent abnormal oxidation of a metal layer without occurring thermal budget and the deterioration of a gate insulating layer during gate re-oxidation process, is disclosed. In the present invention, one selected from a group consisting of an iridium(Ir) layer, a ruthenium(Ru) layer and an osmium(Os) layer capable of forming a nonvolatile conductive metal oxide layer, is used as a metal layer of a gate electrode instead of a W layer in conventional art. Therefore, although a gate re-oxidation process is performed by a well known method, it is effectively prevented that the metal layer is abnormally oxidized, thereby forming an uniform oxide layer on the side wall of the gate. Furthermore, since the oxide layer is conductive, the resistivity of the gate electrode is reduced.

11 Claims, 2 Drawing Sheets

METHOD OF FORMING GATE ELECTRODE IN SEMICONDUCTOR DEVICE

BACKGROUND OF THE INVENTION

1. Field of the Invention

The present invention relates to a method of manufacturing a semiconductor device, and more particularly to a method of forming a gate electrode in a semiconductor device.

2. Description of the Related Art

In general, a gate electrode of a MOS transistor has been formed of a polysilicon layer. The polysilicon layer has the advantage of being stable in forming process. However, as high integration of semiconductor device, the line widths of a gate electrode and other patterns become fine. Recently, the line width is reduced below 0.15 µm. Therefore, there is problem that it is difficult to apply the doped polysilicon layer to a gate electrode material in a high speed device, since the doped polysilicon layer has a high resistivity.

This problem is also growing more and more serious as the high integration of the semiconductor. Accordingly, to overcome the problem, a gate electrode with a polycide structure in which a silicide layer using refractory metal such as tungsten(W) and titanium(Ti) is formed on the doped polysilicon layer, is proposed. However, since the gate electrode with the polycide structure is limited to speed up an ultra high integration semiconductor device, recently a technique of using refractory metal such as tungsten(W) as a gate electrode material has been researched and developed.

FIG. 1 is a cross sectional view showing a W-gate electrode according to a conventional art.

Referring to FIG. 1, a gate oxide layer is grown on a silicon substrate 10 and a doped polysilicon layer 12 is deposited thereon. A WN layer 13 as a diffusion barrier and a W layer 14 are then deposited on the polysilicon layer 12, in sequence and a mask oxide layer 15 is formed thereon.

Next, the mask oxide layer 15, the W layer 14, the WN layer 13 and the polysilicon layer 12 are sequentially etched to form a gate electrode. Thereafter, for removing damage and recovering the reliability of the gate insulating layer 11 due to the etching process, a gate re-oxidation process is performed to form a thermal oxide layer 17 on the side wall of the gate electrode.

Here, the gate re-oxidation process is performed at high temperature under oxygen atmosphere. However, the W layer 14 is abnormally oxidized by the gate re-oxidation process, to form a tungsten oxide($WO_3$) layer 16 on the side wall of the W layer 14, thereby deteriorating the morphology of the gate electrode, as shown in FIG. 1. Therefore, it is difficult to perform a side wall spacer process and ion-implantation for forming source/drain subsequently, thereby deteriorating device properties. Furthermore, in case the W layer 14 is extremely oxidized, its W content decreases, thereby increasing the resistivity of the gate electrode.

To overcome the problems, N. Yamamoto proposes Wet Hydrogen Oxidation process (refer to Journal of Electrochemical Society, Vol. 133, pp. 401. (1986)) as a new gate re-oxidation process. However, in this process, since oxidation process is performed at high temperature (for example, about 1,000° C.) for long time in order to form a thermal oxide layer of a selected thickness, very large thermal budget occurs in semiconductor devices in which a metal layer may be used as a gate electrode material.

Furthermore, to overcome the problems, in case the gate re-oxidation process is performed under nitrogen atmosphere, the properties of gate oxide layer is not good comparing with using oxygen atmosphere.

SUMMARY OF THE INVENTION

It is therefore an object of the present invention to a method of forming a gate electrode in a semiconductor device which can effectively prevent abnormal oxidation of a metal layer without occurring thermal budget and the deterioration of a gate insulating layer during gate re-oxidation process, for solving the problems in the conventional art.

In the present invention, one selected from a group consisting of an iridium(Ir), a ruthenium(Ru) and an osmium (Os) layer capable of forming a nonvolatile conductive metal oxide layer, is used as a metal layer of a gate electrode instead of a W layer in conventional art. Therefore, although a gate re-oxidation process is performed by a well-known method, abnormal oxidation of the metal layer is effectively prevented, thereby forming a uniform oxide layer on the side wall of the gate electrode. Furthermore, since the oxide layer is conductive, the resistivity of the gate electrode is reduce.

To accomplish this above object, a method of forming a gate electrode in a semiconductor device, comprising the steps of: forming a gate insulating layer and a polysilicon layer on a semiconductor substrate, in sequence; forming a diffusion barrier layer on the polysilicon layer; forming a metal layer on the diffusion barrier layer, the metal layer forming conductive metal oxide layer during oxidation; etching the metal layer, the diffusion barrier layer and the polysilicon layer to form a gate electrode; and oxidizing the resultant substrate by a gate re-oxidation process.

Additional object, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

DETAILED DESCRIPTION OF THE INVENTION

Hereinafter, preferred embodiments of the present invention will be explained with reference to accompanying drawings.

Figure 1:
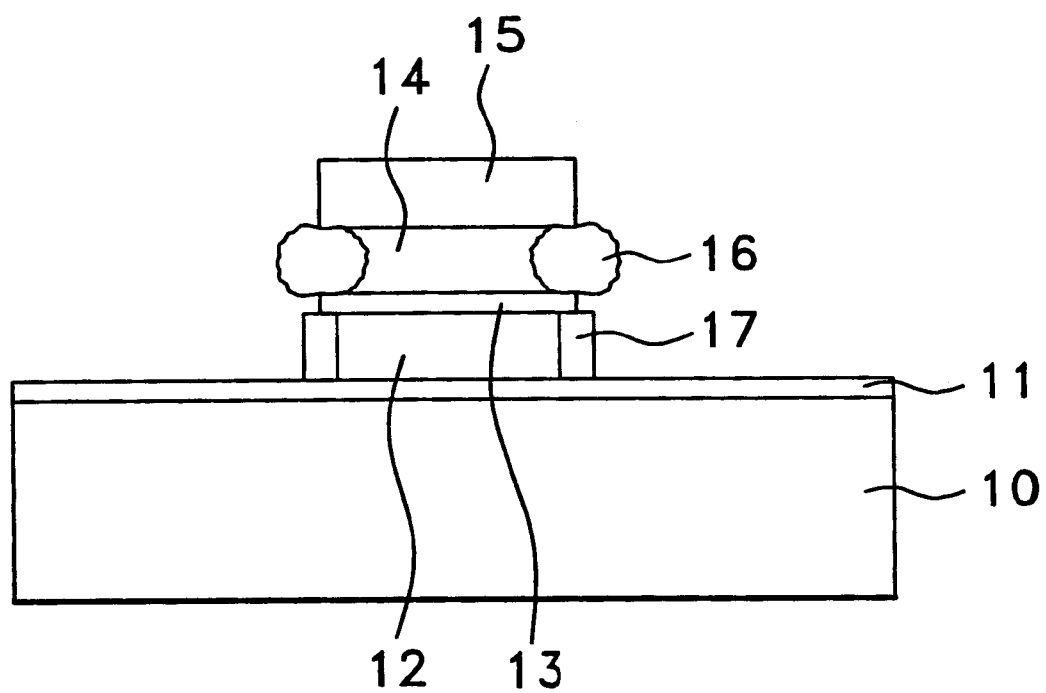
FIG. 1 is a cross sectional view showing a W-gate electrode according to a conventional art.
Figure 2A:
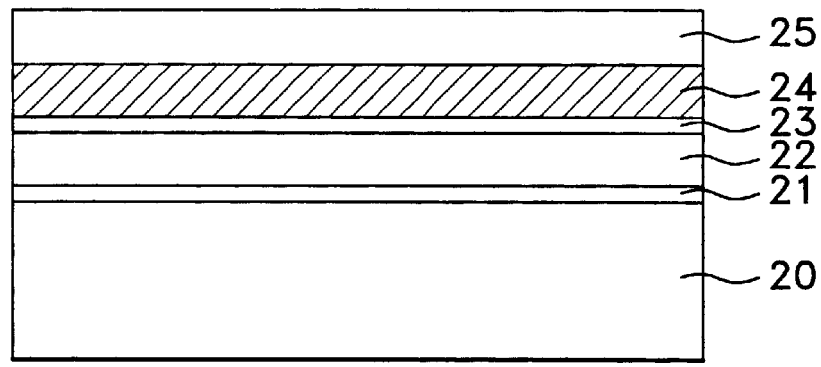
FIG. 2A to FIG. 2C are cross sectional views showing a process of forming a Ir-gate electrode according to an embodiment of the present invention.

As shown in FIG. 2A, a gate oxide layer 21 is grown on a silicon substrate 20 and a doped polysilicon layer 22 is formed thereon to the thickness of 500 to 1,500 Å. A diffusion barrier layer 23 and a iridium(Ir) layer 24 are then deposited on the polysilicon layer 22, sequentially. Here, the diffusion barrier 23 is deposited to the thickness of 50 to 300 Å using a WN layer or TiN layer and the Ir layer 24 is deposited to the thickness of 300 to 1,000 Å. Next, a mask oxide layer 25 is deposited on the Ir layer 24.

Figure 2B:
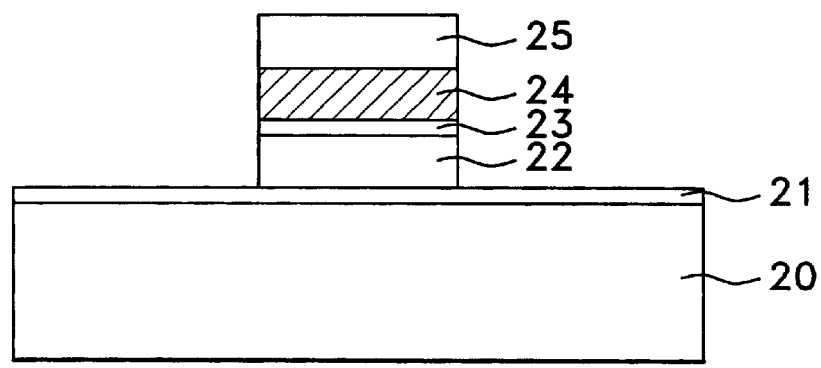

As shown in FIG. 2B, the mask oxide layer 25, the Ir layer 24, the diffusion barrier layer 23, and the polysilicon layer 22 are sequentially etched by dry etching to form a gate electrode. At this time, a portion of the gate oxide layer 21 is etched as not shown in the drawings.

Figure 2C:
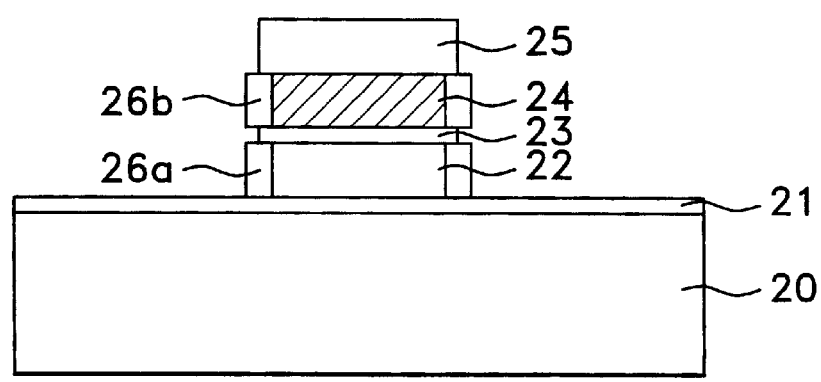

As shown in FIG. 2C, for removing damage and recovering the reliability of the gate insulating layer 21 due to the etching process, gate re-oxidation process is performed by a well-known method to form a thermal oxide layer 26a on the side wall of the polysilicon layer 22 and to form a conductive iridium oxide($IrO_2$) layer 26b on the side wall of the Ir layer 24. Since the conductive iridium oxide($IrO_2$) has a resistivity less than 200 $\mu\Omega$·cm, it's conductivity is good. Preferably, the gate re-oxidation process is performed at the temperature of 700 to 900° C. by wet or dry oxidation and the thermal oxide layer 26a and the $IrO_2$ layer 26b are uniformly formed to the thickness of 30 to 150 Å, respectively.

Thereafter, as not shown in FIG. 2C, lightly doped drain (LDD) ion-implantation and side wall spacer processes are sequentially performed and source/drain ion-implantation process is then performed.

As above described, an Ir layer is used as a metal layer of a gate electrode, so that it is prevented that the metal layer is abnormally oxidized during the gate re-oxidation process.

Although the preferred embodiment of this invention has been disclosed for illustrative purpose, those skilled in the art will appreciate that various modifications, additions and substitutions are possible, without departing from the scope and spirit of the invention as described in the accompanying claims. For example, a ruthenium(Ru) layer and an osmium (Os) layer capable of forming a nonvolatile conductive metal oxide layer are used as the metal layer of the gate electrode instead of the Ir layer.

According to the present invention as above described, by using the Ir layer as the metal layer of the gate electrode, although a gate re-oxidation process is performed by a well-known method set up for forming a conventional polysilicon-gate or polycide-gate, it is effectively prevented that the metal layer is abnormally oxidized during a gate re-oxidation process. As a result, electrical properties of the gate electrode and process are stabilized without performing additional process.

What is claimed is:

1. A method of forming a gate electrode in a semiconductor device, comprising the steps of:
    forming a gate insulating layer and a polysilicon layer on a semiconductor substrate, in sequence;
    forming a diffusion barrier layer on the polysilicon layer;
    forming a metal layer on the diffusion barrier layer, the metal layer capable of forming a conductive metal oxide layer during oxidation, wherein the metal layer is formed of one selected from a group consisting of an Iridium (Ir) layer, a Ruthenium (Ru) layer, and an Osmium (Os) layer;
    etching the metal layer, the diffusion barrier layer and the polysilicon layer, to form a gate electrode and;
    oxidizing the resultant substrate by a gate re-oxidation process, wherein the re-oxidation process forms uniformly sized oxidation layers on the sidewalls of the polysilicon and metal layers, respectively.

2. The method according to claim 1, wherein the metal layer is formed to the thickness of 300 to 1,000 Å.

3. The method according to claim 1, wherein the metal layer is formed of the thickness of 300 to 1,000 Å.

4. The method according to claim 1, wherein the diffusion barrier metal is formed of a TiN layer or a WN layer.

5. The method according to claim 1, the gate re-oxidation process is performed at the temperature 700 to 900° C. under oxygen atmosphere.

6. The method of forming a gate electrode in a semiconductor device according to claim 1, wherein the uniform oxidation layers are formed to a thickness of 30 to 150 Å.

7. The method of forming a gate electrode in a semiconductor device according to claim 1, wherein the uniform oxidation layers include a thermal oxidation layer formed on the side walls of the polysilicon layer and a metal oxidation layer formed on the side walls of the metal layer.

8. A method of forming a gate electrode in a semiconductor device, comprising the steps of:
    forming a gate insulating layer and a polysilicon layer on a semiconductor substrate, in sequence;
    forming a diffusion barrier layer on the polysilicon layer;
    forming a metal layer on the diffusion barrier layer, the metal layer capable of forming a conductive metal oxide layer during oxidation, wherein the metal layer is formed of an iridium (Ir) layer;
    etching the metal layer, the diffusion barrier layer and the polysilicon layer, to form a gate electrode; and
    oxidizing the resultant substrate by a gate re-oxidation process.

9. A method of forming a gate electrode in a semiconductor device, comprising the steps of:
    forming a gate insulating layer and a polysilicon layer on a semiconductor substrate, in sequence;
    forming a diffusion barrier layer on the polysilicon layer;
    forming a metal layer on the diffusion barrier layer, the metal layer capable of forming a conductive metal oxide layer during oxidation, wherein the metal layer is formed of an osmium (Os) layer;
    etching the metal layer, the diffusion barrier layer and the polysilicon layer, to form a gate electrode; and
    oxidizing the resultant substrate by a gate re-oxidation process.

10. A method of forming a gate electrode in a semiconductor device, comprising the steps of:
    forming a gate insulating layer and a polysilicon layer on a semiconductor substrate, in sequence;
    forming a diffusion barrier layer on the polysilicon layer;
    forming a metal layer on the diffusion barrier layer, the metal layer capable of forming a conductive metal oxide layer during oxidation;
    etching the metal layer, the diffusion barrier layer and the polysilicon layer, to form a gate electrode;
    oxidizing the resultant substrate by a gate re-oxidation process, wherein the re-oxidation process forms a metal oxide layer on the side wall of the metal layer, wherein the metal oxide layer has a resistivity of less that 200 $\mu\Omega$·cm.

11. A method of forming a gate electrode in a semiconductor device, comprising the steps of:
    forming a gate insulating layer and a polysilicon layer on a semiconductor substrate, in sequence;
    forming a diffusion barrier layer on the polysilicon layer;
    forming a metal layer on the diffusion barrier layer, the metal layer capable of forming a conductive metal oxide layer during oxidation, wherein the metal layer is formed of one selected from a group consisting of an iridium (Ir) layer, a ruthenium (Ru) layer and an osmium (Os) layer;
    etching the metal layer, the diffusion barrier layer and the polysilicon layer, to form a gate electrode; and
    oxidizing the resultant substrate by a gate re-oxidation process, wherein the re-oxidation process forms uniformly sized oxidation layers on the side walls of the polysilicon and metal layers, respectively.

* * * * *